US011725270B2

(12) United States Patent
Wang et al.

(10) Patent No.: US 11,725,270 B2
(45) Date of Patent: Aug. 15, 2023

(54) PVD TARGET DESIGN AND SEMICONDUCTOR DEVICES FORMED USING THE SAME

(71) Applicant: Taiwan Semiconductor Manufacturing Co., Ltd., Hsinchu (TW)

(72) Inventors: Chia-Hsi Wang, Hsinchu (TW); Yen-Yu Chen, Hsinchu (TW); Yi-Chih Chen, Hsinchu (TW); Shih Wei Bih, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 317 days.

(21) Appl. No.: 17/115,700

(22) Filed: Dec. 8, 2020

(65) Prior Publication Data

US 2021/0238731 A1 Aug. 5, 2021

Related U.S. Application Data

(60) Provisional application No. 62/968,078, filed on Jan. 30, 2020.

(51) Int. Cl.
| | |
|---|---|
| *C23C 14/34* | (2006.01) |
| *H01L 21/768* | (2006.01) |
| *H01J 37/34* | (2006.01) |
| *C23C 14/14* | (2006.01) |
| *H01L 21/285* | (2006.01) |
| *H01L 23/532* | (2006.01) |

(52) U.S. Cl.
CPC .......... *C23C 14/3407* (2013.01); *C23C 14/14* (2013.01); *C23C 14/3464* (2013.01); *H01J 37/3429* (2013.01); *H01J 37/3435* (2013.01); *H01L 21/2855* (2013.01); *H01L 21/7684* (2013.01); *H01L 21/76802* (2013.01); *H01L 21/76843* (2013.01); *H01L 21/76877* (2013.01); *H01L 23/53238* (2013.01)

(58) Field of Classification Search
CPC . C23C 14/3464; C23C 14/34; C23C 14/3407; C23C 14/3414; H01L 21/2855; H01L 21/76849; H01L 21/76871; H01L 23/53238
See application file for complete search history.

(56) References Cited

U.S. PATENT DOCUMENTS

| | | | |
|---|---|---|---|
| 6,187,682 B1 | 2/2001 | Denning et al. | |
| 8,729,702 B1 * | 5/2014 | Niu | H01L 23/481 |
| | | | 257/E23.161 |

(Continued)

FOREIGN PATENT DOCUMENTS

| | | |
|---|---|---|
| CN | 101473059 A | 7/2009 |
| CN | 105593399 A | 5/2016 |

(Continued)

*Primary Examiner* — Jaehwan Oh
(74) *Attorney, Agent, or Firm* — Seed IP Law Group LLP

(57) ABSTRACT

A physical vapor deposition (PVD) target for performing a PVD process is provided. The PVD target includes a backing plate and a target plate coupled to the backing plate. The target plate includes a sputtering source material and a dopant, with the proviso that the dopant is not impurities in the sputtering source material. The sputtering source material includes a diffusion barrier material.

20 Claims, 9 Drawing Sheets

(56) References Cited

U.S. PATENT DOCUMENTS

| | | | |
|---|---|---|---|
| 10,017,849 B2 | 7/2018 | Bellman et al. | |
| 2004/0141870 A1 | 7/2004 | Michaluk et al. | |
| 2005/0185454 A1* | 8/2005 | Brown | G11C 11/15 |
| | | | 365/171 |
| 2010/0266804 A1* | 10/2010 | Fery | G11B 7/2437 |
| | | | 204/192.1 |
| 2014/0138832 A1* | 5/2014 | Niu | H01L 21/76849 |
| | | | 438/643 |
| 2014/0306271 A1* | 10/2014 | Wu | H01L 29/78 |
| | | | 438/285 |
| 2015/0333012 A1 | 11/2015 | Chang et al. | |
| 2017/0148739 A1* | 5/2017 | Roberts | H01L 21/7685 |
| 2020/0335331 A1* | 10/2020 | Xiao | C23C 14/225 |
| 2021/0111300 A1* | 4/2021 | Fessehatzion | C23C 14/568 |

FOREIGN PATENT DOCUMENTS

| | | |
|---|---|---|
| JP | S63161164 A | 7/1988 |
| JP | H07278804 A | 10/1995 |
| JP | H0959770 A | 3/1997 |
| JP | 2001262331 A | 9/2001 |
| JP | 2002060934 A | 2/2002 |
| JP | 2002294440 A | 10/2002 |
| TW | 201425624 A | 7/2014 |

\* cited by examiner

PVD TARGET DESIGN AND SEMICONDUCTOR DEVICES FORMED USING THE SAME

PRIORITY CLAIM AND CROSS-REFERENCE

This application claims the benefit of U.S. Provisional Patent Application No. 62/968,078, filed Jan. 30, 2020, which is incorporated by reference herein.

BACKGROUND

Integrated circuits, used in advanced electronics devices, enable applications such as high-speed computing and data storage. Nanoscale transistors and metal interconnects form the two essential building blocks of an integrated circuit. The transistors perform the logic functions. Generally, after a transistor is formed, electrical contacts are made to connect a source region, a drain region, and/or a gate region of the transistor to make the transistor fully functional. Subsequently, metal interconnects provide the wiring between transistors are formed.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions and spatial relationship(s) of the various features may be arbitrarily enlarged or reduced for clarity. Like reference numerals denote like features throughout specification and drawings.

DETAILED DESCRIPTION

Figure 1:
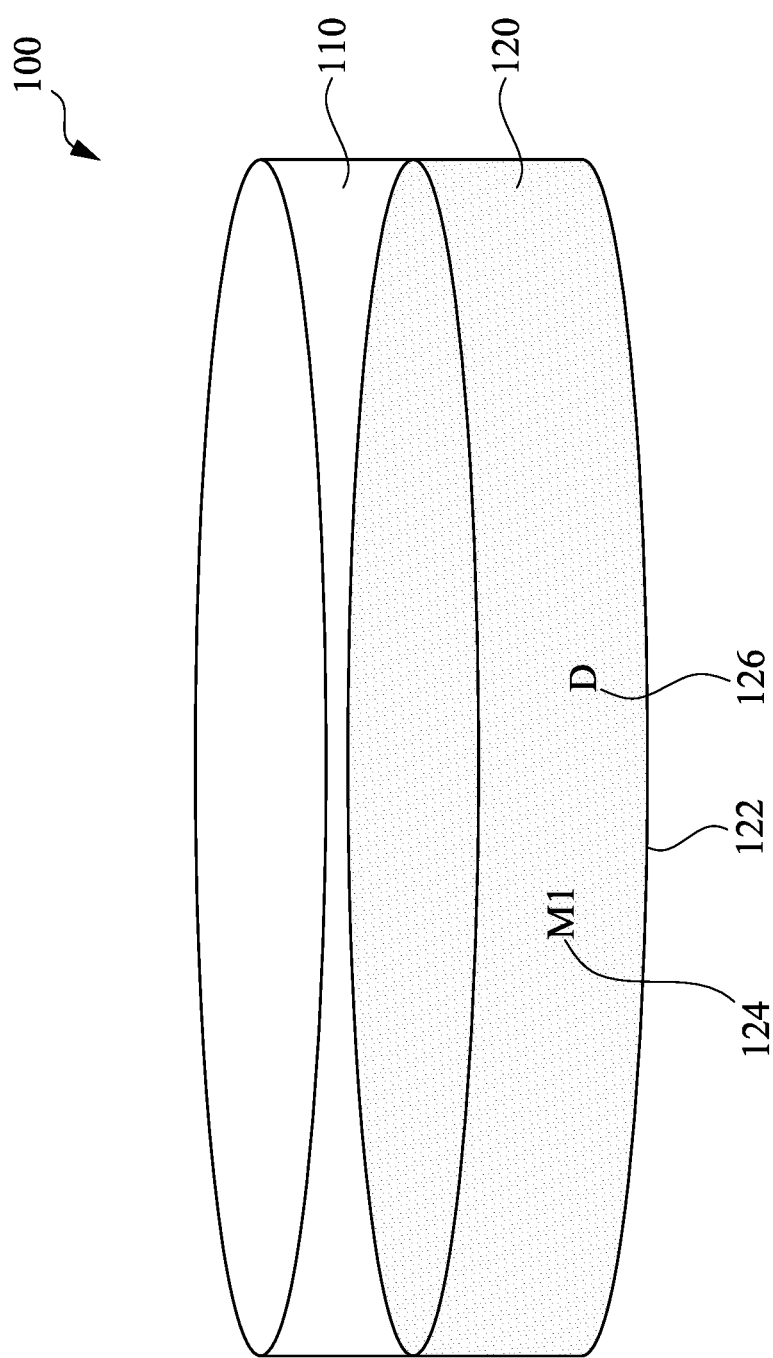
FIG. 1 is a perspective view of a PVD target, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For formation of electrical contacts for a transistor, lithographic techniques are used to define contact openings in a dielectric layer that overlies the source, drain, and gate regions of the transistor. The contact openings are then filled with a metal filling material (e.g., copper) to form electrical contacts.

For formation of metal interconnects, single and/or dual-damascene processes are typically used. In these processes, contact openings includes trenches or combinations of trenches and vias are first etched in a dielectric layer, followed by deposition of a diffusion barrier layer. The contact openings are then filled with a metal filling material (e.g., copper) to form the metal interconnects.

As circuits are scaled to smaller dimensions in a continual effort to provide increased density and performance, the interconnect linewidth becomes increasingly narrow, which in turn renders the metal interconnects more susceptible to deleterious effects such as electromigration. Electromigration is caused by transfer of conductive metals to the adjacent dielectric layer(s) through diffusion of ions or atoms. Electromigration decreases the reliability of integrated circuits, and eventually may cause degradation or failure of a semiconductor device.

Accordingly, a diffusion barrier layer with improved electromigration properties becomes increasingly important to the reliability of integrated circuits. The diffusion barrier layer may be formed from a metal containing material. Suitable examples of the metal containing material include, but are not limited to, titanium (Ti), tantalum (Ta), titanium nitride (TiN), tantalum nitride (TaN), titanium oxynitride (TiON), tantalum oxynitride (TaON), and combinations thereof.

The material of the diffusion barrier layer is deposited by a conformal deposition process such as, for example, physical vapor deposition (PVD) process. The PVD process is carried out under high vacuum in a deposition chamber containing a substrate (e.g., a semiconductor wafer) and a sputtering source composed of material to be deposited on the substrate, e.g., a PVD target. In the PVD process, the PVD target is negatively biased and exposed to plasma of an inert gas having relatively heavy atoms such as argon (Ar) gas or a gas mixture comprising such inert gas. Bombardment of the PVD target by ions of the inert gas results in ejection of atoms of the PVD target source material. The ejected atoms accumulate as a deposited film on the substrate.

In the PVD process, the compositions of the deposited diffusion barrier layer are restricted by the composition of the PVD target. In embodiments of the present disclosure, to help to avoid device performance degradation due to electromigration of the contact metal, dopants such as nickel (Ni) and the like are introduced into the source material of the PVD target to be deposited on the substrate during the PVD process. Because nickel has a lower metal point than the sputtering source material, the dopants in the sputtering source material of the PVD target affects target material deposition rate, which in turn changes PVD process window and improve wafer accept test yield. Further, the resulting diffusion barrier layer contains the sputtering source material as well as the dopants intentionally introduced in the PVD target. The dopants in the diffusion barrier layer helps to reduce the electromigration effect, which in turns helps to increase the lifetime of the integrated circuits.

FIG. 1 is a perspective view of a PVD target 100, in accordance with some embodiments of the present application. The PVD target 100 is advantageously used with chambers configured to process 200 mm, 300 mm, or 450 mm diameter substrate, although chambers configured to process other size substrates are also contemplated. The PVD target 100 is formed in any suitable shape including, for example, circular, square, rectangular, oval, or triangular. Referring to FIG. 1, the PVD target 100 includes a backing plate 110 and a target plate 120 coupled to the backing plate 110.

The backing plate 110 is composed of or made from a conductive material, such as copper, copper alloys, zinc, copper-zinc alloys, steel, stainless steel, iron, nickel, chromium, copper-chromium alloys, aluminum, lead, silicon, alloys thereof, derivatives thereof, or combinations thereof. In some embodiments, the backing plate 110 contains copper or a copper alloy. In some embodiments, the backing plate 110 includes a copper alloy having a copper concentration a range from about 50% by weight to about 99.9% by weight, such as from about 55% by weight to about 95% by weight. In some other embodiments, the backing plate 110 includes a copper alloy having a copper concentration in a range from about 50% by weight to about 70% by weight. In some embodiments, the backing plate 110 includes a copper-zinc alloy. In some embodiments, the copper-zinc alloy has a copper concentration in a range from about 58% by weight to about 62% by weight and a zinc concentration in a range from about 38% by weight to about 42% by weight. In a specific example, the copper-zinc alloy of the backing plate 110 contains about 60.8% copper by weight and about 39.3% zinc by weight. In other embodiments, the copper-zinc alloy has a copper concentration in a range from about 75% by weight to about 85% by weight and a zinc concentration in a range from about 15% by weight to about 25% by weight. In one specific example, the copper-zinc alloy of the backing plate 110 contains about 80% copper by weight and about 20% zinc by weight.

In some embodiments, the backing plate 110 includes a copper-chromium alloy having a copper concentration a range from about 95% by weight to about 99.5% by weight and a chromium concentration in a range from about 0.5% by weight to about 5% by weight. In a specific example, the copper-chromium alloy of the backing plate 110 contains about 99% copper by weight and about 1% chromium by weight.

Figure 4:
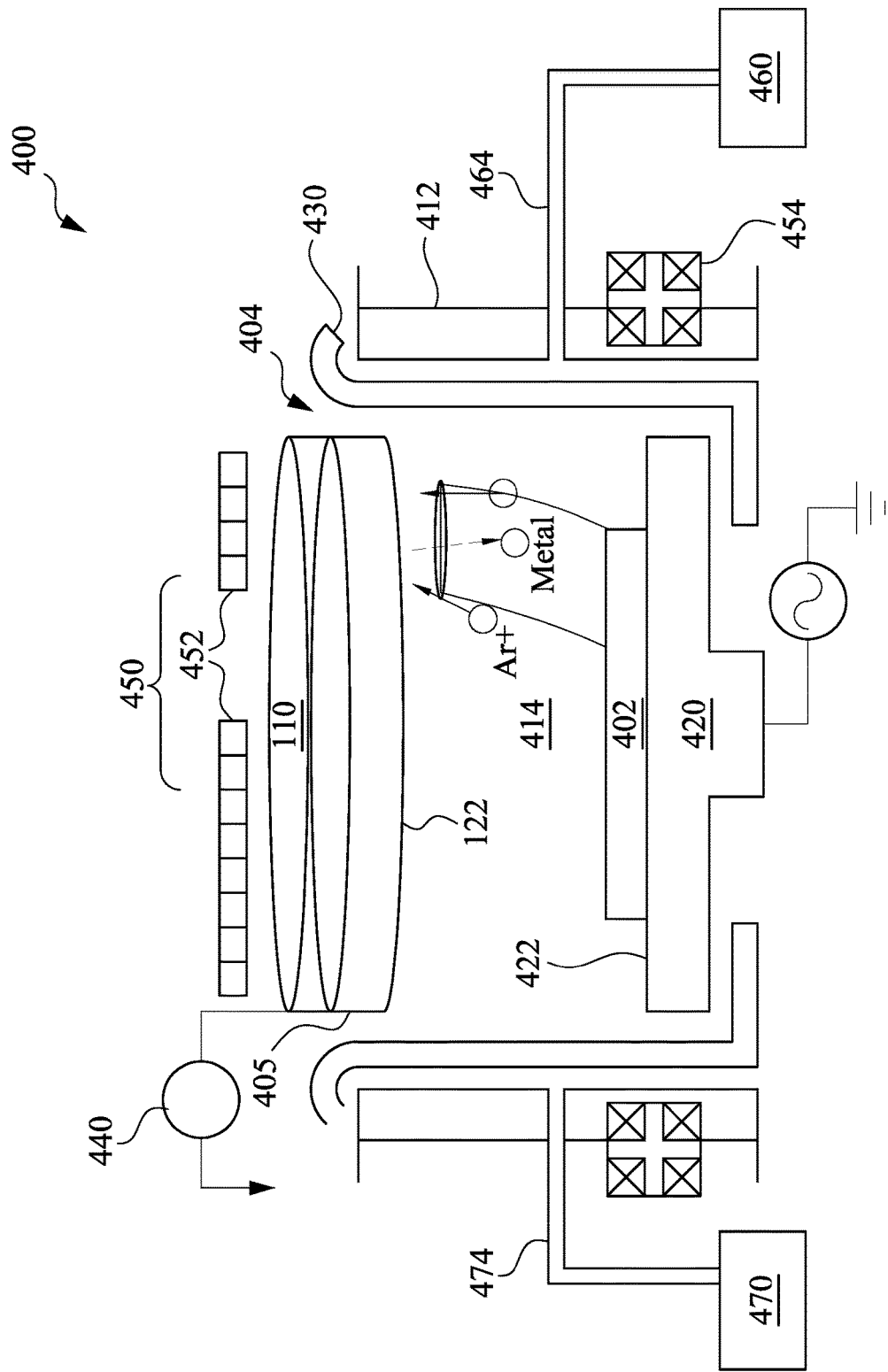
FIG. 4 is a schematic cross-sectional view of a PVD system, in accordance with some embodiments.

The target plate 120 includes a front surface (i.e., sputterable surface) 122 that is sputtered during the PVD process. The materials in the target plate 120 are, thus, deposited onto a substrate (e.g., a semiconductor wafer), e.g., substrate 402 (FIG. 4). In some embodiments, the front surface 122 of the target plate 120 is substantially flat. In some embodiments, the front surface 122 of the target plate 120 is curved. The target plate 120 is comprised of a sputtering source material (M1) 124 and a dopant 126. The dopant 126 helps to improve the EM characteristics of the sputtering source material 124, which in turn helps to avoid device performance degradation due to the electromigration of the contact metal in the contact structures. The dopant 126 also affects the deposition rate of the sputtering source material 124, which in turn changes PVD process window and improve wafer accept test yield. In some embodiments, the materials (e.g., sputtering source material 124 and dopant 126) from the target plate 120 are deposited as part of the process for forming a diffusion barrier layer in contact structures (e.g., source/drain contact structures and interconnect structures) of integrated circuits. In some embodiments, the sputtering source material 124 include a metal that is capable of preventing the diffusion of a conductive metal (e.g., copper) in contact structure into the adjacent dielectric layer. For example, in some embodiments, the sputtering source material 124 include Ti or Ta. The sputtering source material 124 contained within the target plate 120 has a high purity level, such as a purity level of about 99.99% (4N) or greater, about 99.995% (4N5) or greater, or about 99.999% (5N) or greater, or about 99.9995% (5N5) or greater. The purity level is indicative of the sputtering source material 124 concentration relative to the centration of impurities other than the dopant 126 intentionally introduced therein. In some embodiments, the sputtering source material 124 has a purity of about 99.999% (5N). The dopant 126 is selected to help to improve electromigration characteristics of the sputtering source material 124. In some embodiments, the dopant is nickel (Ni). The concentration of the dopant 126 in the sputtering source material 124 is from about 0.025 parts per million (ppm) to about 0.04 ppm. If the concentration of the dopant 126 in the sputtering source material 124 is too great, the resistance of the resulting diffusion barrier layer is too high, which reduces the device performance, in some instances. If the concentration of the dopant 126 in the sputtering source material 124 is too low, the improved electromigration effect in the resulting diffusion barrier layer is not achieved, which in turn results in no improvement in the reliability, in some instances the integrated circuits.

The dopant 126 is introduced into the sputtering source material 124 in different manners. In some embodiments, the dopant 126 is introduced into the sputtering source material 124 with a uniform distribution. In some other embodiments, the dopant 126 is introduced into the sputtering source material 124 with a gradient distribution. In some embodiments, the centration of the dopant 126 in the target plate 120 decreases gradually from front to the back with the highest concentration near the front surface 122. In some embodiments, the centration of the dopant 126 in the target plate 120 increases gradually from front to the back with the lowest concentration near the front surface 122. In some embodiments, the dopant 126 is introduced into the sputtering source material 124 in a locally delimited manner such that the dopant is only present in localized regions of the target plate 120.

In some embodiments, the target plate 120 is diffusion bonded to the backing plate 110. In other embodiments, the targeting plate 120 is bonded to the backing plate 110 by an interlayer (not shown) disposed therebetween. The optional interlayer helps to increase the adhesion between the backing plate 110 and the target plate 120. In some embodiments, the interlayer contains a metal, such as aluminum, copper, nickel, derivatives thereof, or alloys thereof and may be in the form of a metallic insert, film, plate, or solder.

Figure 2:
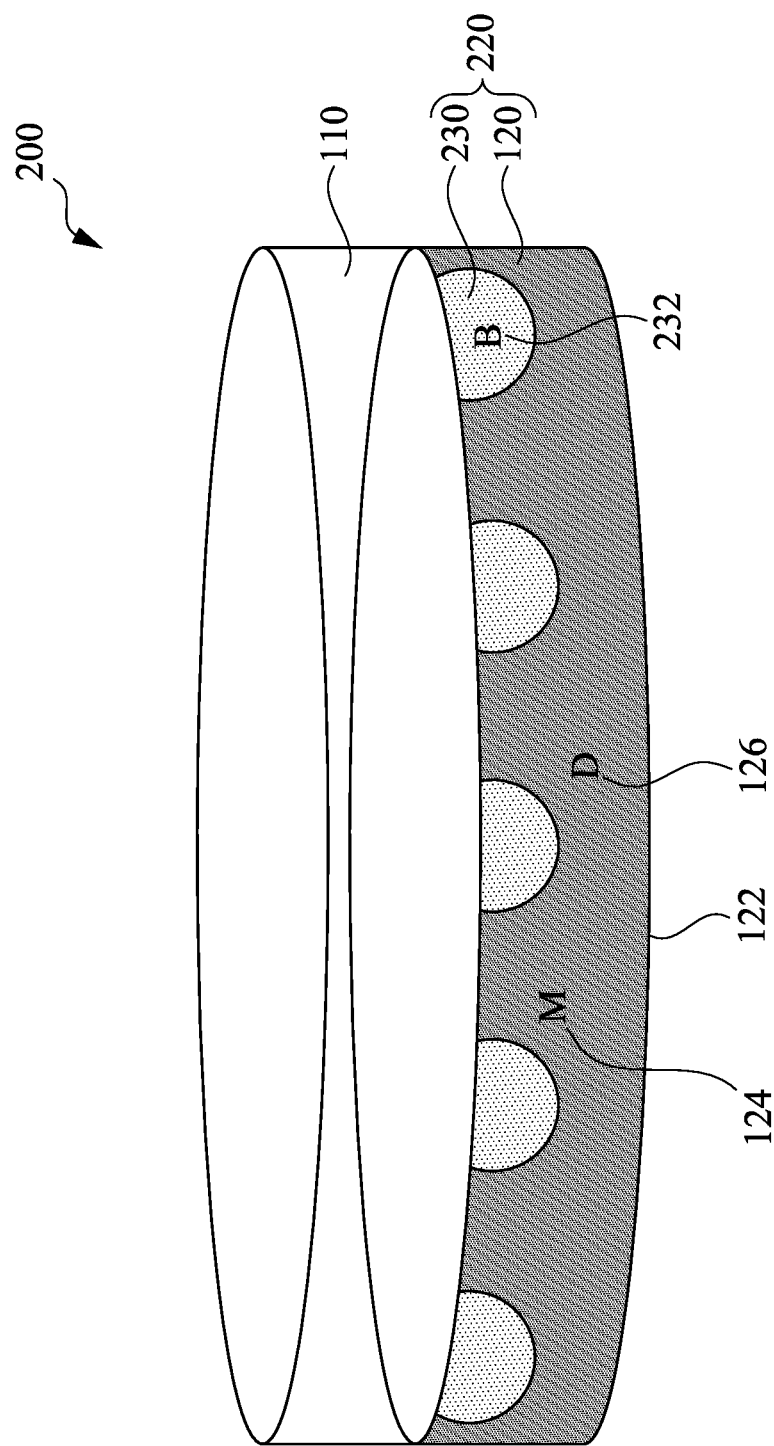
FIG. 2 is a perspective view of a PVD target, in accordance with some embodiments.

FIG. 2 is a perspective view of a PVD target 200, in accordance with some embodiments of the present disclosure. Referring to FIG. 2, the PVD target 200 includes a backing plate 110 and a target plate 220 coupled to the backing plate 110. In comparison with the PVD target 100 of FIG. 1, in the PVD target 200, the target plate 220 has a multicomponent structure including a first target component 120 and a plurality of second target components 230 embedded in the first target component 120. Components in the PVD target 200 that are the same or similar to those in FIG. 1 are given the same references numbers, and detailed description thereof is thus omitted.

As in FIG. 2, the first target component 120 provides a front surface (i.e., sputterable surface) 122 of the target plate 220 that is sputtered during the PVD process. In some embodiments, the first target component 120 includes a sputtering source material (M) 124 and a dopant 126 as described above. The second target components 230 are located at the back side of the target plate 220 adjacent to the plating plate 110. In some embodiments, the second target components 230 are uniformly distributed in the first target component 120 such that the second target components 230 are spaced apart from each other by a same distance. In some embodiments, the second target components 230 are randomly distributed in the first target component 120 such that the second target components 230 are spaced apart from each other by different distances. Each of the second target components 230 includes a target base material 232. As used herein, the target base material refers to a material constituting the PVD target but is not sputtered during the PVD process. The target Base material 232 may be the same as, or different from, the sputtering source material 124. In some embodiments, the target base material 232 is the same as the sputtering source material 124, but with a lower purity. For example, in some embodiments, when the sputtering source material 124 is Ti having a purity of about 99.9995% (5N5) or greater, the target base material 232 is also Ti but with a purity of less than 99.9995% (5N5). In some embodiments, the target base material 232 in the second target components 230 has a purity of about 99.995% (4N5). In some embodiments, the target base material 232 is a metal having a cost lower than that of the sputtering source material 124.

During the PVD process, only the first target component 120 is sputtered, while the second target components 230 are intact. Consequently, using a material (i.e., the target base material 232) having a lower purity or a lower cost than the material to be sputtered (i.e., the sputtering source material 124) in the second target components 230 helps to reduce the cost of the PVD target 200, which also helps to reduce the fabrication cost costs and increase profitability.

Figure 3:
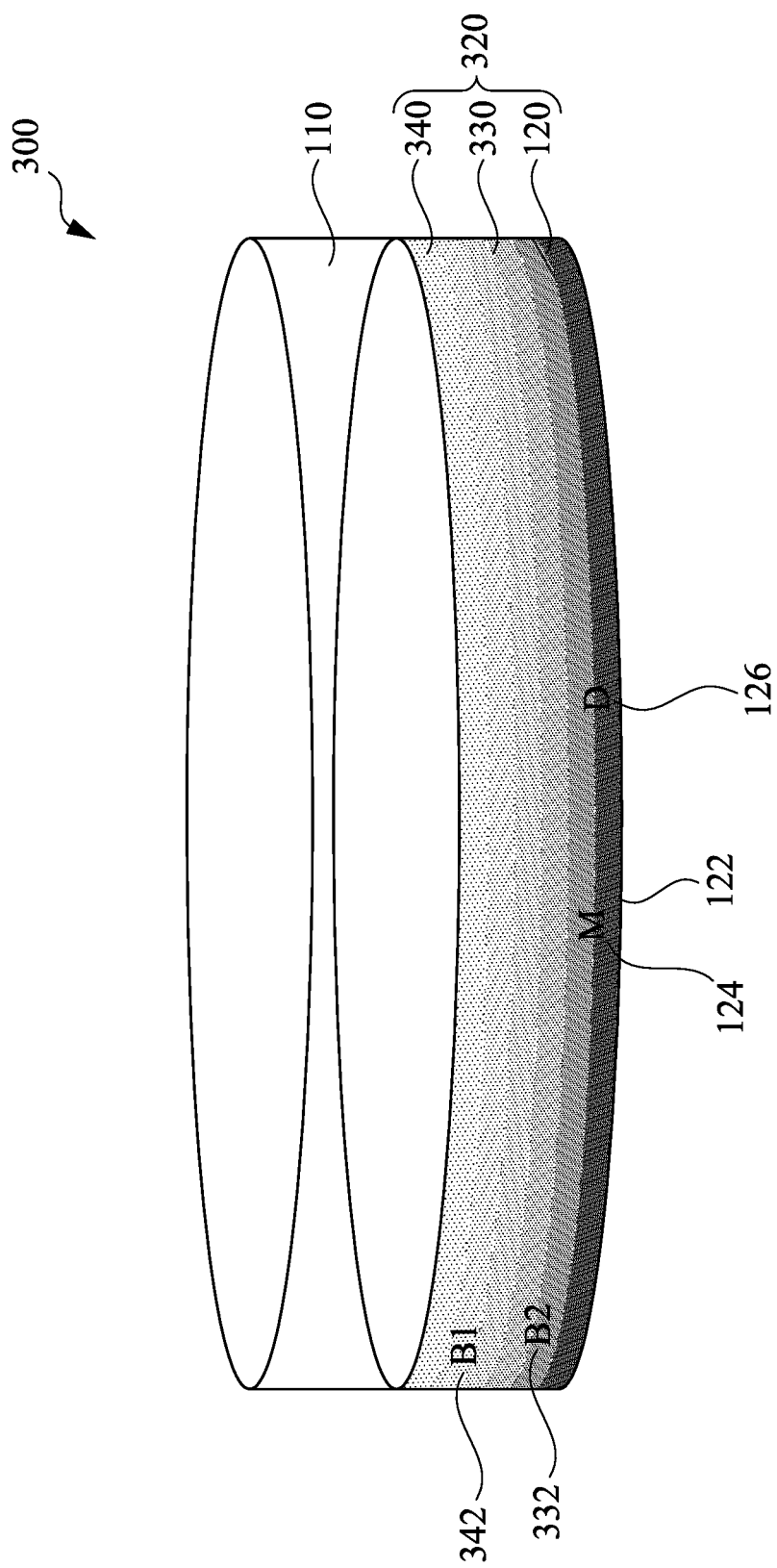
FIG. 3 is a perspective view of a PVD target, in accordance with some embodiments.

FIG. 3 is a perspective view of a PVD target 300, in accordance with some embodiments of the present disclosure. Referring to FIG. 3, the PVD target 300 includes a backing plate 110 and target plate 320 coupled to the backing plate 110. In comparison with the PVD target 100 of FIG. 1, in the PVD target 300, the target plate 320 has a stacked structure including a first target component 120, a second target components 330, and a third target component 340. Components in the PVD target 300 that are the same or similar to those in FIG. 1 are given the same references numbers, and detailed description thereof is thus omitted.

As in FIG. 3, the first target component 120 provides a front surface (i.e., sputterable surface) 122 of the target plate 320 that is sputtered during the PVD process. In some embodiments, the first target component 120 includes a sputtering source material (M) 124 and a dopant 126.

The second target component 330 is over the first target component 120. In some embodiments, the second target component 330 has a same dimension as that of the first target component 120. In some embodiments, the second target components 330 includes a first target base material (Ti) 332. The first target base material 332 may be the same as, or different from, the sputtering source material 124. In some embodiments, the first target base material 332 is the same as the sputtering source material 124, but with a lower purity. For example, in some embodiments, when the sputtering source material 124 is Ti having a purity of about 99.9995% (5N5) or greater, the first target base material 332 is also Ti but with a purity of less than 99.9995% (5N5). In some embodiments, the first target base material 332 in the second target component 330 has a purity of about 99.999% (5N). In some embodiments, the first target base material 332 is a metal having a cost lower than that of the sputtering source material 124.

The third target component 340 is over the second target component 330 adjacent to the plating plate 110. In some embodiments, the third target component 340 has a same dimension as that of the second target component 330. In some embodiments, the third target components 340 includes a second target base material (B2) 342. The second target base material 342 may be the same as, or different from, the first target base material 332. In some embodiments, the second target base material 342 is the same as the first target base material 332, but with a lower purity. For example, in some embodiments, when the first target base material 332 is Ti having a purity of about 99.999% (5N), the second target base material 342 is also Ti but with a purity of less than 99.999% (5N). In some embodiments, the second target base material 342 in the third target component 340 has a purity of about 99.995% (4N5). In some embodiments, the second target base material 342 has a metal having a cost lower than that of first second target base material 332. The third target component 340 is optional and is omitted in some embodiments.

During the PVD process, only the first target component 120 is sputtered, while the second target component 330 and the third target component 340 are intact. Such target configuration helps to reduce the cost of the PVD target 300, which also helps to reduce the fabrication costs and increase profitability.

FIG. 4 is a schematic cross-sectional view of a PVD system 400, in accordance with some embodiments of the present disclosure. The PVD system 400 is capable of depositing a doped metallic material such as titanium, titanium nitride, tantalum, tantalum nitride, onto a substrate, for example, substrate 402 using a PVD target 404 of the present disclosure. The PVD target 404 can be a PVD target 100, 200, 300 as described above in respective FIGS. 1, 2 and 3. During the PVD process, the PVD target 404 is bombarded by energetic ions, such as a plasma, causing material to be knocked off the target and deposited as a film on the substrate 402.

In some embodiments, the PVD system 400 is a magnetron PVD system including a chamber body 412 which encloses a processing region or a plasma zone 414.

A substrate support 420 is disposed within the chamber body 412. The substrate support 420 has a substrate receiving surface 422 that receives and supports the substrate 402 during the PVD process, so that a surface of the substrate 402 is opposite to the front surface 122 of the PVD target 404 that is exposed to the processing region 414. The substrate support 420 is electrically conductive and is coupled to ground (GND) so as to define an electrical field between the PVD target 404 and the substrate 402. In some embodiments, the substrate support 420 is composed of aluminum, stainless steel, or ceramic material. In some embodiments, the substrate support 420 is an electrostatic chuck that includes a dielectric material.

A shield 430, also referred to as a dark space shield, is positioned inside the PVD chamber body 412 and proximate sidewalls 405 of the PVD target 404 to protect inner surfaces of the chamber body 412 and sidewall (i.e., target sidewall 405) of the PVD target 404 from unwanted deposition. The shield 430 is positioned very close to the target sidewall 405 to minimize re-sputtered material from being deposited thereon. The shield 430 has a plurality of apertures (not shown) defined therethrough for admitting a plasma-forming gas such as argon (Ar) from the exterior of the shield 430 into its interior.

A power supply 440 is electrically coupled to the backing plate 110 of the PVD target 404. The power supply 440 is configured to negatively bias the PVD target 404 with respect to the chamber body 412 to excite a plasma-forming gas, for example, argon, into a plasma. In some embodiments, the power supply 440 is a direct current (DC) power supply source. In other embodiments, the power supply 440 is a radio frequency (RF) power supply source.

A magnet assembly 450 is disposed above the PVD target 404. The magnet assembly 450 is configured to project a magnetic field parallel to the front surface 122 of the PVD target 404 to trap electrons, thereby increasing the density of the plasma and increasing the sputtering rate. In some embodiments, the magnet assembly 450 is configured to scan about the back of the PVD target 404 to improve the uniformity of deposition. In some embodiments, the magnet assembly 450 includes a single magnet disposed above the PVD target 404 (not shown). In some embodiments, the magnet assembly 450 includes an array of magnets. In some embodiments and as shown in FIG. 4, the magnet assembly 450 includes a pair of back magnets 452 disposed above the PVD target 404. In some embodiments, the magnet assembly 450 also includes a side electromagnet 454 around the chamber body 412.

A gas source 460 is in fluidic combination with the chamber body 412 via a gas supply pipe 464. The gas source 460 is configured to supply a plasma-forming gas to the process region 414 via the gas supply pipe. The plasm-forming gas in an inert gas and do not react with the materials in the PVD target 404. In some embodiments, the plasma-forming gas includes argon, xenon, neon, or helium, which is capable of energetically impinging upon and sputtering source material and the dopant from the PVD target 404. In some embodiments, the gas source 460 is also configured to supply a reactive gas into the PVD system 400. The reactive gas includes one or more of an oxygen-containing gas, a nitrogen-containing gas, a methane-containing gas, that is capable of reacting with the sputtering source material in the PVD target 404 to form a layer on the substrate 402.

A vacuum device 470 is in fluidic communication with the PVD system 400 via an exhaust pipe 474. The vacuum device 470 is used to create a vacuum environment in the PVD system 400 during the PVD process. In some embodiments, the PVD system 400 has a pressure in a range from about 1 mtorr to about 10 torr. The spent process gases and byproducts are exhausted from the PVD system 400 through the exhaust pipe 474.

Figure 5:
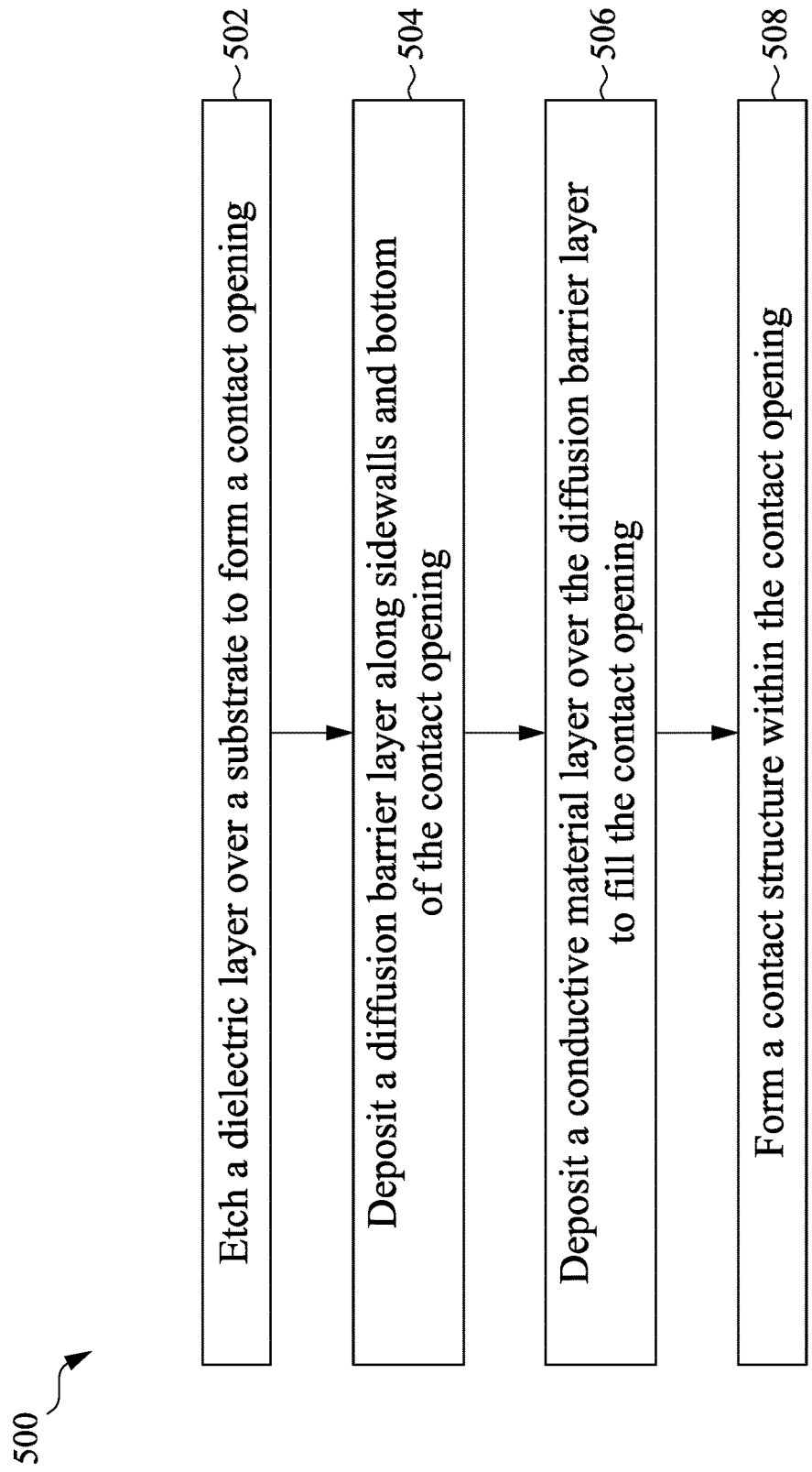
FIG. 5 is a flowchart of a method of fabricating a semiconductor device, in accordance with some embodiments.

FIG. 5 is a flowchart of a method 500 of fabricating a semiconductor device 600, in accordance with some embodiments of the present disclosure. FIGS. 6A-6D are cross-sectional views of the semiconductor device 600 in various stages of the method 500, in accordance with some embodiments. The method 500 is discussed in detail below, with reference to the semiconductor device 600, in FIGS. 6A-6D. In some embodiments, additional operations are performed before, during, and/or after the method 500, or some of the operations described are replaced and/or eliminated. In some embodiments, additional features are added to the semiconductor device 600. In some embodiments, some of the features described below are replaced or eliminated. One of ordinary skill in the art would understand that although some embodiments are discussed with operations performed in a particular order, these operations may be performed in another logical order.

Figure 6A:
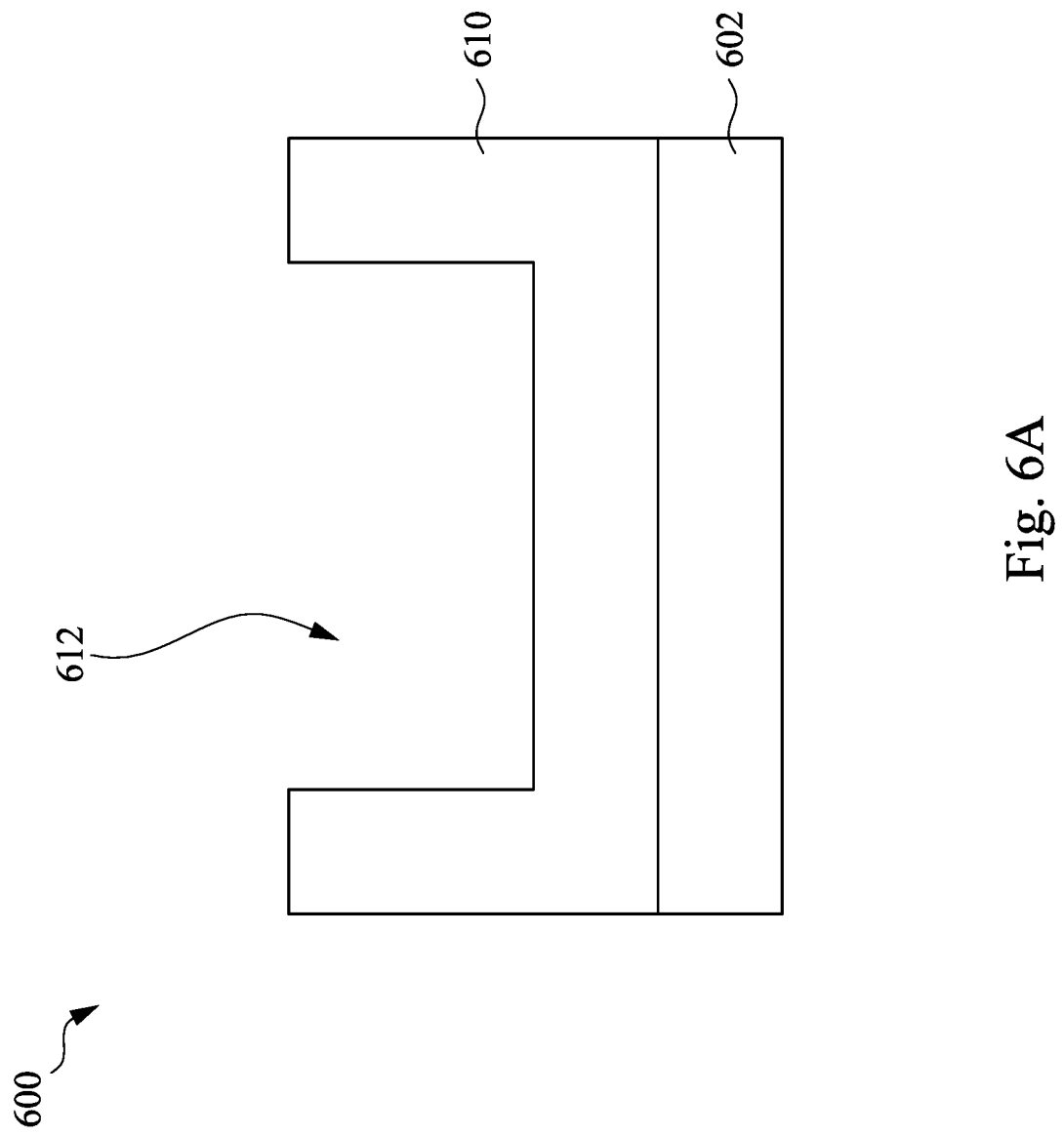
FIGS. 6A-6D are cross-sectional views of a semiconductor device in various stages of the method of FIG. 5, in accordance with some embodiments.

Referring to FIGS. 5 and 6A, the method 500 includes operation 502, in which a dielectric layer 610 over a substrate 602 is etched to form a contact opening 612. The contact opening 612 can be used to form a source/drain contact structure, a gate contact structure, or an interconnect structure. FIG. 6A is a cross-sectional view of a semiconductor device 600 after etching the dielectric layer 610 to form the contact opening 612.

In some embodiments, the substrate 602 is a bulk semiconductor substrate including silicon. Alternatively or additionally, in some embodiments the bulk semiconductor substrate includes another elementary semiconductor such as germanium, a compound semiconductor including gallium arsenide, gallium, phosphide, indium phosphide, indium arsenide, and/or indium antimonide, an alloy semiconductor including SiGe, GaAsP, AlInAs, AlGaAs, GaInAs, GaInP, and/or GaInAsP; or combinations thereof. In some embodiments, the substrate 602 includes an epitaxial layer. For example, the substrate 602 has an epitaxial layer overlying a bulk semiconductor substrate. Furthermore, in some embodiments, the substrate 602 is a semiconductor on insulator (SOI) substrate. For example, the substrate 602 includes a buried oxide (BOX) layer formed by a process such as separation by implanted oxygen (SIMOX) or other suitable techniques, such as wafer bonding and grinding.

In some embodiments, the substrate 602 further includes active devices such as p-type field effect transistors (PFET), n-type FET (NFET), metal-oxide semiconductor (MOS) transistors, complementary metal-oxide semiconductor (CMOS) transistors, bipolar transistors, high voltage transistors, and/or high frequency transistors. In some embodiments, the transistors are planar transistors or three-dimensional fin-type transistors. In some embodiments, the substrate 602 further includes passive devices such as resistors, capacitors, and/or inductors. The substrate 602 further includes isolation structures such as shallow trench isolation (STI) structures to separate various active and/or passive devices from one another.

The dielectric layer 610 is deposited over the substrate 602. In some embodiments and as in FIG. 6A, the dielectric layer 610 is deposited directly above and in contact with the substrate 602. In some embodiments, one or more dielectric layers containing contact structures therein are disposed between the dielectric layer 610 and the substrate 602.

In some embodiments, the dielectric layer 610 includes silicon oxide. In some embodiments, the dielectric layer 610 includes a low-k dielectric material having a dielectric constant (k) less than 4. In some embodiments, the low-k dielectric material has a dielectric constant from about 1.2 to about 3.5. In some embodiments, the dielectric layer 610 includes tetraethylorthosilicate (TEOS) oxide, undoped silicate glass, or doped silicate glass such as borophosphosilicate glass (BPSG), fluorosilica glass (FSG), phosphosilicate glass (PSG), boron doped silicon glass (BSG), and/or other suitable dielectric materials. In some embodiments, the dielectric layer 610 is deposited by chemical vapor deposition (CVD), plasma enhanced chemical vapor deposition (PECVD), PVD, or spin coating. In some embodiments, the dielectric layer 610 is planarized by a planarization process or otherwise recessed to provide a planar top surface. In some embodiments, the top surface of the dielectric layer 610 is planarized using a CMP process.

The dielectric layer 610 is subsequently etched to form a contact opening 612 therein. The contact opening 612 is a trench opening, a via opening, or a combination of a trench opening and a via opening with the via opening enclosed by the trench opening. In some embodiments and as in FIG. 6A, the contact opening 612 is a trench opening. Although only a single contact opening is illustrated and described in FIG. 6A, it is understood that any number of contact openings can be formed. In some embodiments and as shown in FIG. 6A, the contact opening 612 extends into a portion of the dielectric layer 610, exposing a sublayer of the dielectric layer 610. In some embodiments, the contact opening 612 extends through the dielectric layer 610, exposing a surface of the substrate 602.

The dielectric layer 610 is etched with one or more lithography and etching processes. In some embodiments, the lithography process includes applying a photoresist layer (not shown) over the dielectric layer 610, exposing the photoresist layer to a pattern, performing post-exposure baking, and developing the resist to form a patterned photoresist layer (not shown). The patterned photoresist layer exposes a portion of the dielectric layer 610 where the contact opening 612 is to be formed. Next, the portion of the dielectric layer 610 exposed by the patterned photoresist layer is etched to form the contact opening 612. In some embodiments, the dielectric layer 610 is etched using a dry etch such as, for example, a reactive ion etch (RIE) or a plasma etch. In some embodiments, the dielectric layer 610 is etched using a wet etch. After formation of the contact opening 612 in the dielectric layer 610, the patterned photoresist layer is removed, for example, by wet stripping or plasma ashing. Alternatively, in some embodiments, a hard mask is used such that the contact opening pattern is transferred from the pattered photoresist layer to the hard mask by a first etch and then transferred to the dielectric layer 610 by a second etch.

Figure 6B:
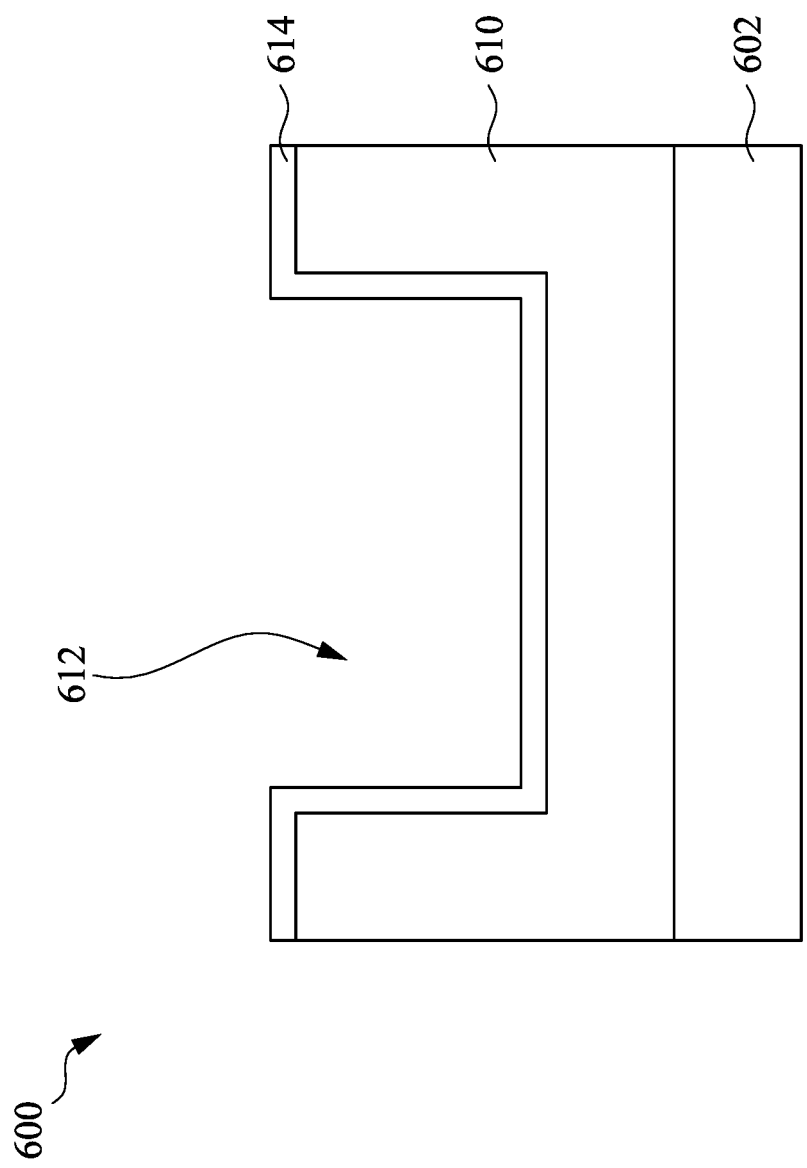

Referring to FIGS. 5 and 6B, the method 500 proceeds to operation 504, in which a diffusion barrier layer 614 is deposited along sidewalls and bottom of the contact opening 612 and over the top surface of the dielectric layer 610. FIG. 6B is a cross-sectional view of the semiconductor device 600 of FIG. 6A after depositing the diffusion barrier layer 614 along sidewalls and bottom of the contact opening 612 and over the top surface of the dielectric layer 610.

The diffusion barrier layer 614 includes a doped diffusion barrier material that prevents the metal in a conductive material layer subsequently formed from diffusing into the dielectric layer 610. Exemplary diffusion barrier materials include, but are not limited to, Ti, Ta, Ru, TiN, TaN, and WN. In some embodiments, the diffusion barrier layer 614 includes a stack of the above-mentioned diffusion barrier materials such as, for example, Ti/TiN or Ta/TaN. Example dopants include, but are not limited to, Ni and F. In some embodiments, the diffusion barrier layer 614 includes Ni doped Ti. In some embodiments, the diffusion barrier layer 614 is deposited utilizing a PVD process using a PVD target, e.g., PVD target 100, 200, or 300 described above, during which the substrate 602 is placed into the PVD system 400 (FIG. 4), and the PVD target 100, 200, or 300, is sputtered by a plasma that is induced in the PVD system 400. The thickness of the diffusion barrier layer 614 that is formed is from about 10 Angstrom (Å) to about 30 Å. If the thickness of the diffusion barrier layer 614 is too small, the effect of preventing metal diffusion is not achieved, in some instances. If the thickness of the diffusion barrier layer 614 is too great, the effect of preventing metal diffusion does not change but the metal filing process window is decreased, in some instances.

Figure 6C:
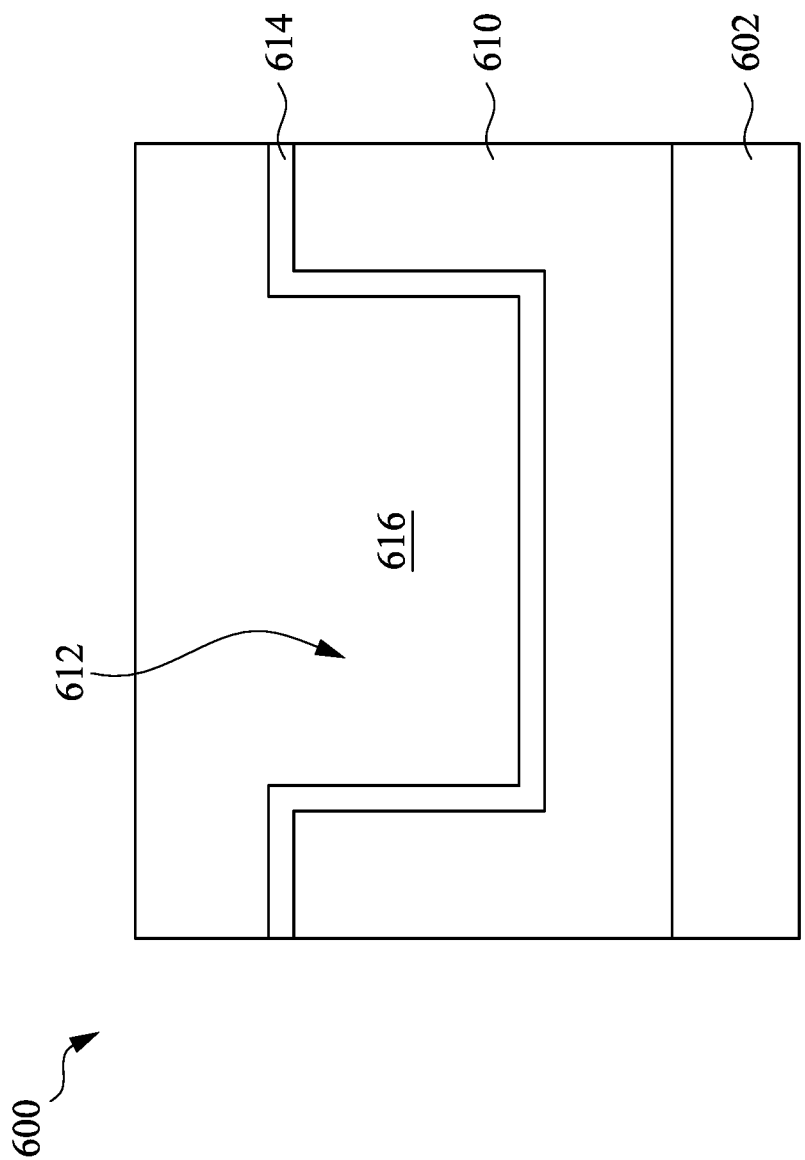

Referring to FIGS. 5 and 6C, the method 500 proceeds to operation 506, in which a conductive material layer 616 is deposited over the diffusion barrier layer 614 to fill the contact opening 612. FIG. 6C is a cross-sectional view of the semiconductor device 600 of FIG. 6B after depositing the conductive material layer 616 over the diffusion barrier layer 614 to fill the contact opening 612.

In some embodiments, the conductive material layer 616 includes Cu, Al, W, Co, alloys thereof, or other suitable conductive metals. In some embodiments, the conductive material layer 616 is deposited by a suitable deposition process such as, for example, CVD, PECVD, PVD, or plating. In some embodiments, especially when Cu or a Cu alloy is employed in the conductive material layer 616, an optional plating seed layer (not shown) is formed over the diffusion barrier layer 614 prior to the formation of the conductive material layer 616. In some embodiments, the optional plating seed layer is formed by a deposition process including, for example, CVD, PECVD, or PVD.

Figure 6D:
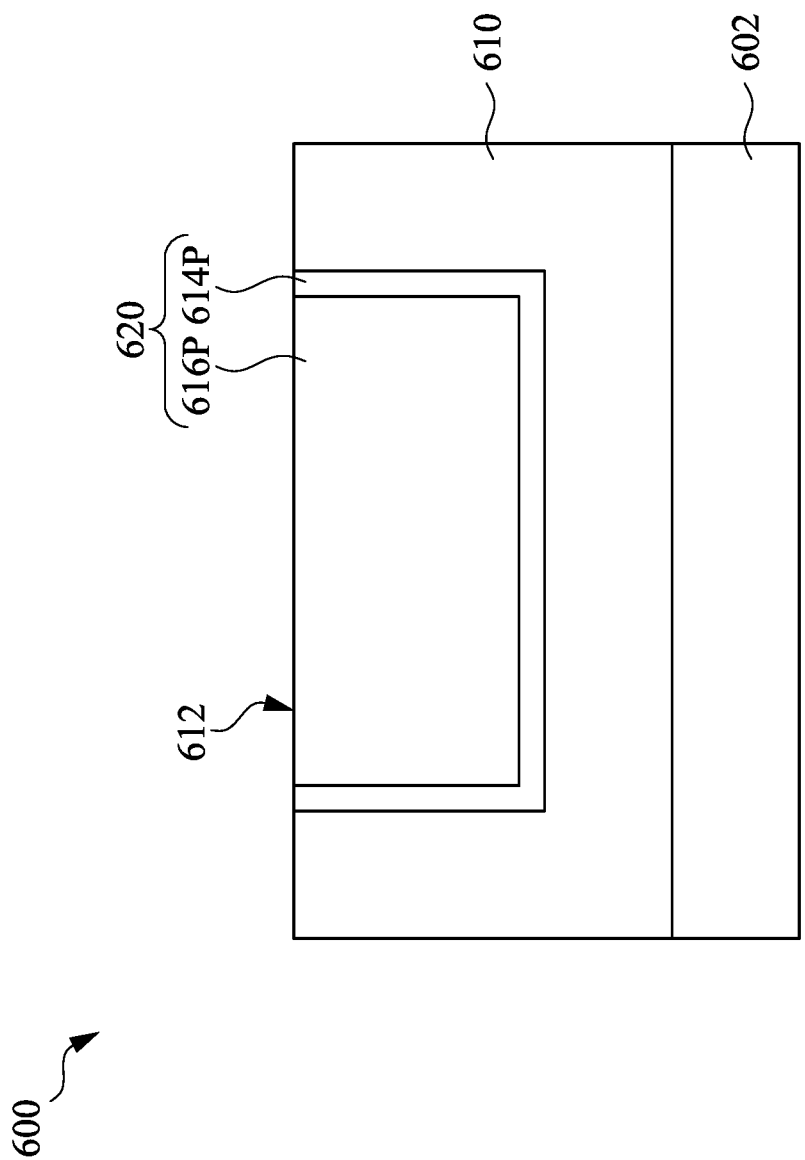

Referring to FIGS. 5 and 6D, the method 500 proceeds to operation 508, in which a contact structure 620 is formed within the contact opening 612. FIG. 6D is a cross-sectional view of the semiconductor device 600 of FIG. 6C after forming the contact structure 620 within the contact opening 612.

A planarization process is performed to remove portions of the conductive material layer 616 and the diffusion barrier layer 614 from the top surface of the dielectric layer 610. In some embodiments, a chemical mechanical polishing (CMP) process is performed to removing portions of the conductive material layer 616 and the diffusion barrier layer 614 from the top surface of the dielectric layer 610. After the planarization, a remaining portion of the conductive material layer 616 in the contact opening 612 constitute a conductive plug 616P, and a remaining portion of the diffusion barrier layer 614 on sidewalls and bottom surface of the contact opening 612 constitute a diffusion barrier 614P. The diffusion barrier 614P and the conductive plug 616P together provide the contact structure 620. In some embodiments, the contact structure 620 is a source/drain contact for providing electrical contact to a source/drain region of a field effect transistor. In some embodiments, the contact structure 620 is an interconnect structure for providing electrical connection among different transistors.

One aspect of this description relates to a PVD target. The PVD target includes a backing plate and a target plate coupled to the backing plate. The target plate includes a sputtering source material and a dopant. The dopant is not impurities in the sputtering source material. The sputtering source material includes a diffusion barrier material.

Another aspect of this description relates to a PVD system. The PVD target includes a backing plate and a target plate coupled to the backing plate. The target plate includes a first target component and a second target component adjacent to the back plate. The first target component includes a sputtering source material and a dopant, and the second target component includes a target base material.

Still another aspect of this description relates to a method of forming a semiconductor device. The method includes forming a contact opening in a dielectric layer over a substrate. The method further includes positioning the substrate into a physical vapor deposition (PVD) chamber facing a PVD target including a target plate. The target plate includes a sputtering source material and a dopant, with the proviso that the dopant is not impurities in the sputtering source material. The sputtering source material includes a diffusion barrier material. The method further includes sputtering the PVD target to deposit a diffusion barrier layer on sidewall and bottom surfaces of the contact opening. The diffusion barrier layer includes the sputtering source material and the dopant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A physical vapor deposition (PVD) target, comprising:
a backing plate; and
a target plate coupled to the backing plate, the target plate comprising a sputtering source material and a dopant, with the proviso that the dopant is not impurities in the sputtering source material, the sputtering source material comprising a diffusion barrier material,
wherein:
A) the dopant is uniformly distributed in the sputtering source material,
B) the dopant is distributed in the sputtering source material with a gradient profile, or
C) the dopant is distributed in the sputtering source material with a localized profile.

2. The PVD target of claim 1, wherein a concentration of the dopant in the sputtering source material is from about 0.025 parts per million (ppm) to about 0.04 ppm.

3. The PVD target of claim 1, wherein the sputtering source material has a purity of about 99.999% or greater.

4. The PVD target of claim 3, wherein the sputtering source material has a purity of about 99.9995%.

5. The PVD target of claim 1, wherein the backing plate comprises copper, aluminum, or a copper alloy.

6. The PVD target of claim 1, further comprising an interlayer bonding the target plate to the backing plate.

7. A physical vapor deposition (PVD) target, comprising:
a backing plate; and
a target plate coupled to the backing plate, the target plate comprising a first target component and a second target component adjacent to the back plate,
wherein the first target component comprises a sputtering source material and a dopant, the sputtering source material providing a sputterable surface that is sputtered during a PVD process, and
wherein the second target component comprises a target base material which is not sputtered during the PVD process.

8. The PVD target of claim 7, wherein the sputtering source material is the same as the target base material, but with a higher purity.

9. The PVD target of claim 8, wherein the sputtering source material has a purity of about 99.9995%, and the target base material has a purity of about 99.999%.

10. The PVD target of claim 7, wherein the sputtering source material is different from the target base material.

11. The PVD target of claim 7, wherein the second target component comprises a plurality of second target components embedded in the first target component, the plurality of second target components being separated from each other.

12. The PVD target of claim 11, where the plurality of second target components is separated from each other by a uniform distance.

13. The PVD target of claim 7, wherein the target plate further comprises a third target component between the second target component and the plating plate, wherein the third target component comprises another target base material different from the target base material in the second target component.

14. The PVD target of claim 7, wherein the sputtering source material comprises titanium or tantalum.

15. The PVD target of claim 7, wherein the dopant comprises nickel.

16. A method for forming a semiconductor device, comprising:
forming a contact opening in a dielectric layer over a substrate;
positioning the substrate into a physical vapor deposition (PVD) chamber facing a PVD target, wherein the PVD target comprises a target plate, the target plate comprising a sputtering source material and a dopant, with the proviso that the dopant is not impurities in the sputtering source material, the sputtering source material comprising a diffusion barrier material,
wherein:
A) the dopant is uniformly distributed in the sputtering source material,
B) the dopant is distributed in the sputtering source material with a gradient profile, or
C) the dopant is distributed in the sputtering source material with a localized profile; and
sputtering the PVD target to deposit a diffusion barrier layer on sidewall and bottom surfaces of the contact opening, wherein the diffusion barrier layer comprises the sputtering source material and the dopant.

17. The method of claim 16, further comprising depositing a conductive material layer on the diffusion barrier layer to fill the contact opening.

18. The PVD target of claim 1, wherein sputtering source material comprises titanium or tantalum, and the dopant comprises nickel.

19. The PVD target of claim 1, wherein a sputterable surface of the target plate that is sputtered during a PVD process is flat.

20. The PVD target of claim 1, wherein a sputterable surface of the target plate that is sputtered during a PVD process is curved.

* * * * *